United States Patent [19]

Nagel

[11] Patent Number: 4,584,545

[45] Date of Patent: Apr. 22, 1986

[54] SINGLE SECTION CIRCUIT BREAKER HAVING A METERING SHUNT

[75] Inventor: Harry H. Nagel, Westwood, N.J.

[73] Assignee: Heinemann Electric Company, Lawrenceville, N.J.

[21] Appl. No.: 629,447

[22] Filed: Jul. 10, 1984

[51] Int. Cl.[4] ............................................. H01H 75/10
[52] U.S. Cl. ...................................... 335/41; 335/42; 324/424
[58] Field of Search ................... 335/41, 42, 13, 6, 16, 335/176; 324/126, 424; 361/102, 115

[56] References Cited

U.S. PATENT DOCUMENTS

| | | | |
|---|---|---|---|
| 3,258,562 | 6/1966 | Hurtle | 335/176 |
| 3,290,627 | 12/1966 | Davis et al. | 335/9 |
| 3,329,913 | 7/1967 | Camp | 335/38 |
| 4,071,836 | 1/1978 | Cook et al. | 335/16 |
| 4,492,941 | 1/1985 | Nagel | 335/13 |

Primary Examiner—Harold Broome

Attorney, Agent, or Firm—Dann, Dorfman, Herrell and Skillman

[57] ABSTRACT

A single pole circuit breaker comprising a single section. The single section, single pole comprises an electromagnetic sensing device and a pair of relatively movable contacts. The electromagnetic sensing device is electrically connected at one end to the load terminal. The movable contacts are engageable with a pair of stationary contacts carried by a line terminal. A metering or calibrating shunt device is connected on one side to the electromagnetic sensing device and is connected on the other side to the pair of movable contacts to thereby connect in electrical series the electromagnetic sensing device and the pair of movable contacts through the metering or calibrated shunt device. A volt meter connected across the calibration points of the metering or calibrated shunt device will then read a voltage proportional to the current flow through the circuit breaker.

10 Claims, 5 Drawing Figures

SINGLE SECTION CIRCUIT BREAKER HAVING A METERING SHUNT

BACKGROUND OF THE INVENTION

This invention relates to electromagnetic circuit breakers of the type disclosed in U.S. Pat. No. 3,290,627, for example, and in my co-pending patent application Ser. No. 467,588, filed Feb. 18, 1983 now U.S. Pat. No. 4,492,941.

In certain applications of circuit breakers, it is desired that the current flowing through the circuit breaker be accurately determined. The use of separate calibrated shunt devices placed in the load or line ends of the circuit breaker for determining the current flowing through the circuit breaker are known. In this invention, the calibrated shunt device is connected between the electromagnetic sensing means and the movable contact so as to more accurately measure the current flowing through the circuit breaker.

BRIEF SUMMARY OF THE INVENTION

In this invention a single pole, single section circuit breaker is provided comprising an electromagnetic sensing device and a set of relatively movable contacts enclosed within a case.

Between tne electromagnetic sensing device and the movable contact is connected the metering or calibrated shunt device. A suitable volt meter is connected to the calibration points of the shunt device to read a voltage proportional to the current flowing through the circuit breaker.

It is an object of this invention to provide a calibrated shunt device for a single pole, single section circuit breaker which is carried by the case and which extends to the rear of the case, but between the load and line terminals thereof and within the space bounded by the width of the case.

It is another object of this invention to provide a cover for the calibrated shunt device which does not extend beyond the space bounded by the width of the case.

The foregoing and other objects of the invention, the principles of the invention and the best modes in which I have contemplated applying such principles will more fully appear from the following description and accompanying drawings in illustration thereof.

BRIEF DESCRIPTION OF THE VIEWS

In the drawings

DESCRIPTION OF THE PREFERRED EMBODIMENT

Figure 1:
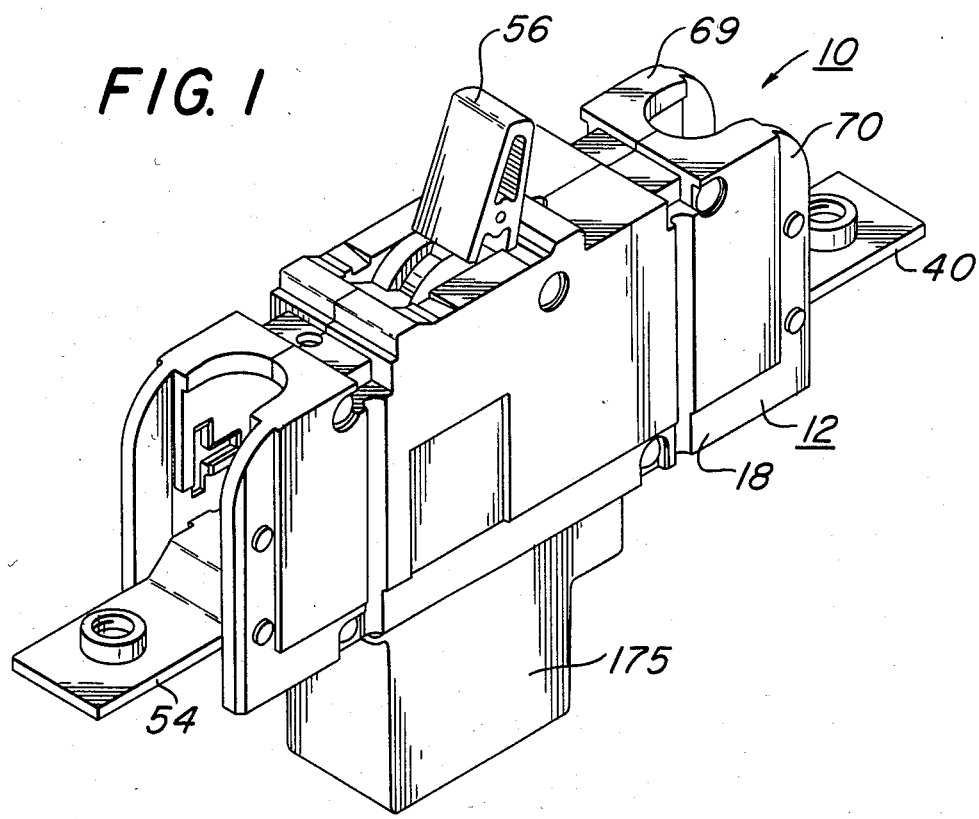
FIG. 1 is a top and front perspective view of a single pole, single section circuit breaker incorporating this invention.

Referring to the drawings, a single pole, single section electromagnetic circuit breaker 10 is shown comprising the single section 12, as shown in FIG. 1. Electromagnetic circuit breakers with linkage mechanisms and electromagnetic sensing devices similar to those incorporated in the circuit breaker 10 are described in U.S. Pat. Nos. 3,058,008; 3,290,627; 3,329,913; and 3,955,152, among others, and in my co-pending U.S. patent application Ser. No. 467,588, filed Feb. 18, 1983.

Figure 3:
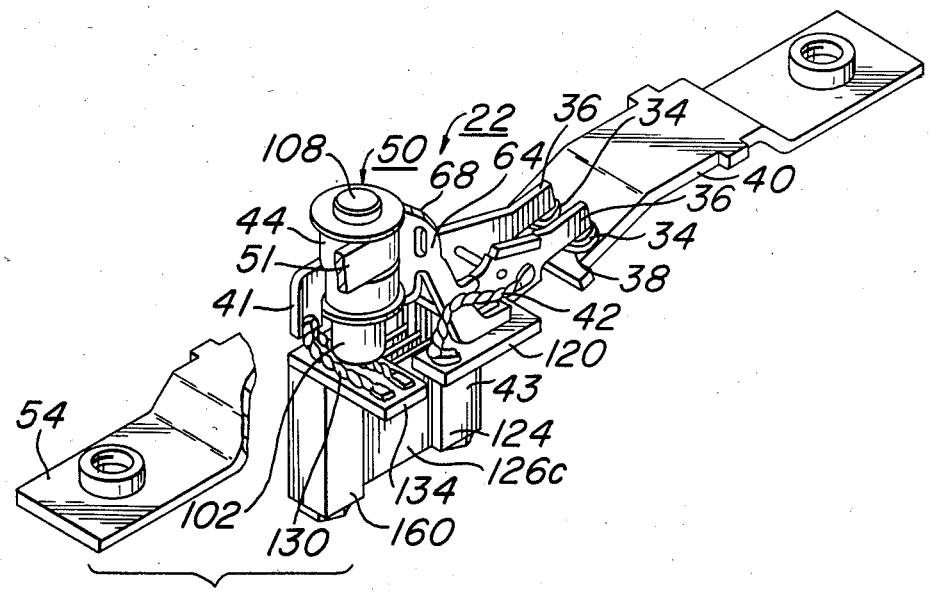
FIG. 3 is a top perspective view of a portion of the circuit breaker shown in FIGS. 1 and 2, but without the case and showing the calibrating or metering shunt connected between the electromagnetic sensing device and the movable contact arms.
Figure 2:
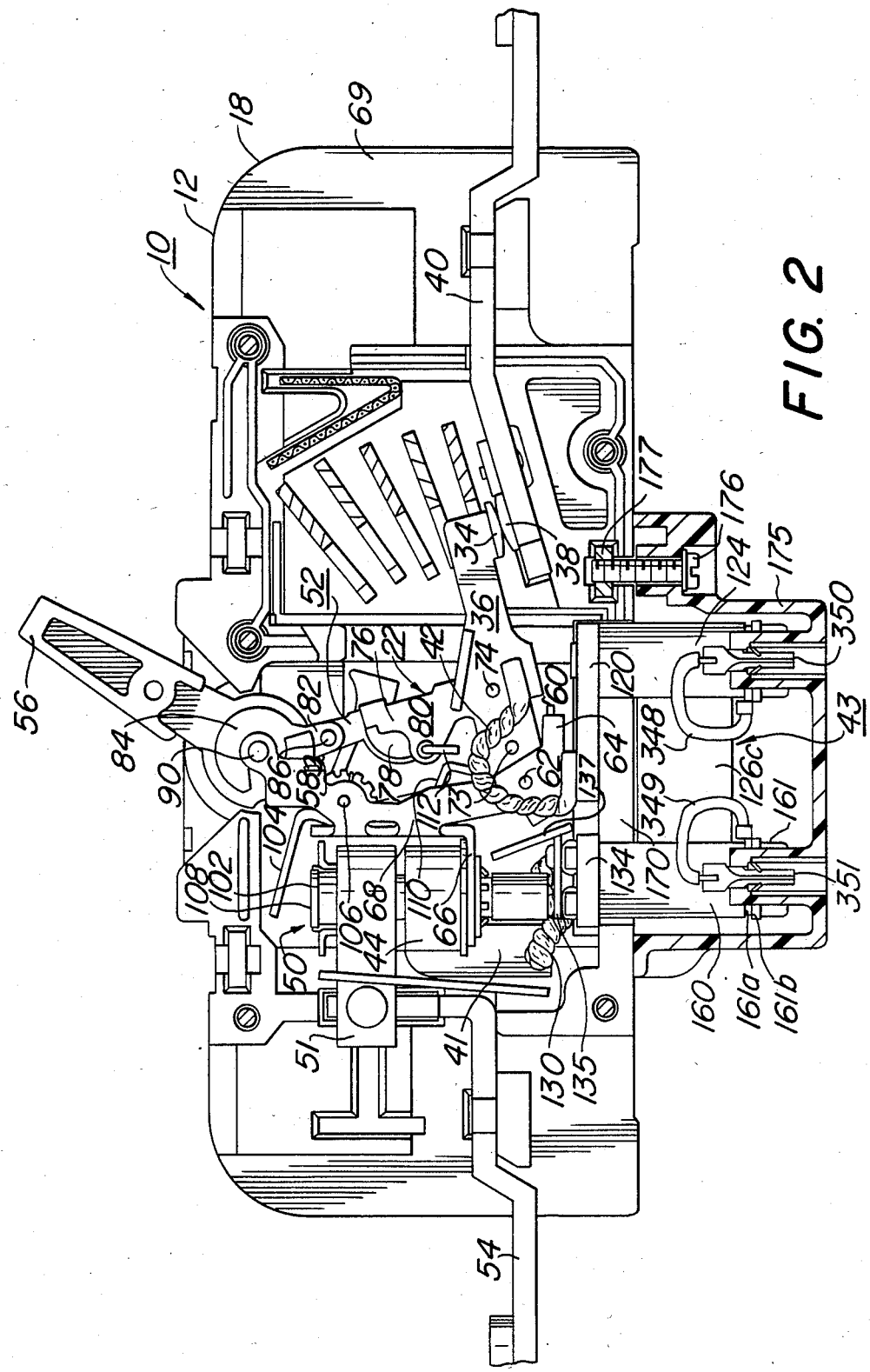
FIG. 2 is a longitudinal, side elevation view of the circuit breaker shown in FIG. 1, but showing one of the half-cases removed with the contacts shown in the contacts closed position, the view being partially in cross section.

The single section 12 includes a case 18 and, as seen in FIGS. 2 and 3, an assembly 22 comprising two movable contacts 34 carried by two movable arms 36 and engageable with two stationary contacts 38, the latter being carried by a line terminal 40. The two movable arms 36 are connected by two flexible conductors 42 (only one of which is shown in FIGS. 2 and 3) to one end of a metering or calibrated shunt device 43 of this invention. The other end of the metering or calibrated shunt device 43 is connected by a flexible conductor 130 to one end 41 of a coil 44 forming part of an electromagnetic sensing device 50. The electromagnetic sensing device 50, on predetermined electrical conditions, collapses a resettable linkage mechanism 52 (FIG. 2) to trip open the contacts 34 and 38. The electrical circuit of the section 12 is completed by connecting the other end 51 of the coil 44 to a load terminal 54. The collapsible linkage mechanism 52 is of the type that resets, i.e., relatches, automatically after the contacts 34 and 38 are tripped open and the handle 56 is moved toward the "off" position by a handle spring 58.

Further, the movable arms 36 are biased by a spring 60 toward the open position of the contacts 34 and 38 and the movable arms 36 are mounted on a pin 62 about which they pivot, the pin 62 being carried by two spaced frame plates 64 (only one of which is shown in FIG. 2) which are part of an L-shaped frame member 66 and jointly form a frame 68 for carrying the coil 44. The end portions of the pin 62 extend into holes (not shown) formed in the opposed side walls of the case 18 formed by half-cases 69 and 70 to properly locate and support the assembly 22 inside the compartment or cavity formed by the half-cases 69 and 70. Another pin 73, carried by the movable arms 36, has end portions which engage the spaced frame plates 64 to limit the opening movement of the arms 36 in the open position of the contacts 34 and 38, the open position of the contacts 34 and 38 not being shown.

The movable arms 36 are also connected by a pin 74 to the linkage mechanism 52 which includes a collapsible toggle assembly 76 having a toggle catch 78 and a U-link 80. The toggle catch 78 is in turn connected to an arm 82 of the pivotal link 84 by a further pin 86. The link 84 is formed with the integral handle 56 and pivots about a pin 90 having its end portions also carried by the spaced frame plates 64. Further, the handle spring 58 is coiled about the pin 90 and has one end attached to one of the frame plates 64 and the other end of the handle spring 58 is in contact with the arm 82, the spring 58 being stressed at all times so as to bias the link 84 in the counterclockwise direction, to the contacts open or "off" position.

After tripping of the linkage mechanism 52 in response to overload, for instance, the handle spring 58 automatically moves the handle link 84 from the contacts closed (circuit breaker "on" position) towards the contacts open (circuit breaker "off" position) and automatically relatches the toggle assembly 76.

The frame 68 forms a part of the electromagnetic sensing device 50 to which may be secured a time delay tube 102 housing a spring biased magnetizable core (not shown) movable against the retarding action of a suitable fluid to provide a time delay before tripping of the mechanism on certain overloads, as is well known.

The operation of this type of linkage mechanism 52 and electromagnetic sensing device 50 is set forth in U.S. Pat. No. 3,329,913 and others, but for purposes of completeness it will only be briefly described herein as follows—if the circuit breaker 10 is in the contacts open position (not shown) when the pivotal handle 56 is moved from the contacts open position to the contacts closed position, the toggle assembly 76 and the movable arm 36 all move down, against the bias of the spring 60, and move the contacts 34 into engagement with the stationary contact 38 achieving the contacts closed position, the position illustrated in FIG. 2.

The electromagnetic device 50 includes an armature 104 which is pivoted on a pin 106 whose end portions are also carried by suitable holes in the frame plates 64. Upon the occurence of a predetermined overload condition, assuming the circuit breaker to be in the contacts closed position, the armature 104 is attracted toward a pole piece 108, either after a time delay period or without an intentional time delay period, i.e, virtually instantaneously, depending on the overload condition. The movement of the armature 104 toward the pole piece 108 causes the oppositely extending trip finger 110, which is integral with the armature 104, to pivot to the right as seen in FIG. 2 and engage and trip the arm 112 forming part of the linkage mechanism 52, whereupon the toggle assembly 76 collapses and the movable arms 36 move upward under the bias of the spring 60 to open the contacts 34 and 38. The collapsing motion of the toggle assembly 76 is independent of the position of the link 84 and the handle 56. The handle 56 is then moved toward the contacts open position, under the pressure applied by the spring 58.

Figure 4:
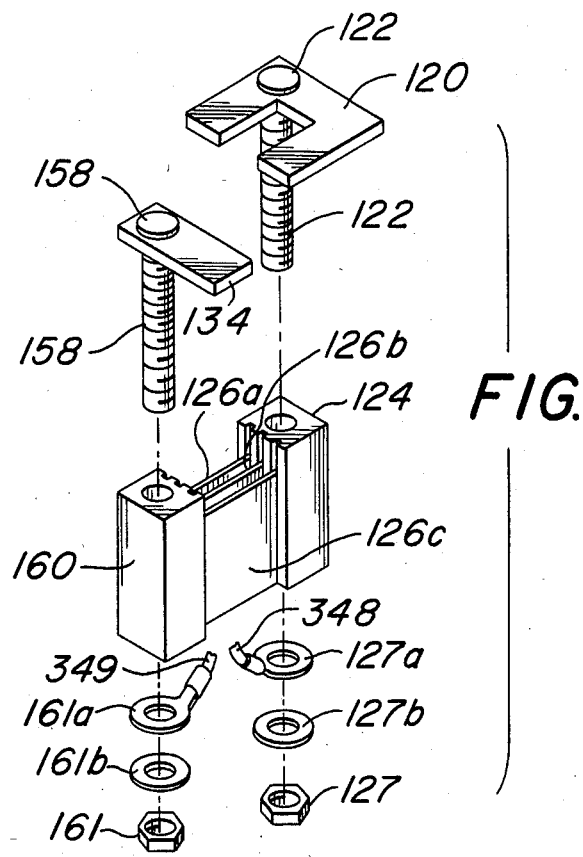
FIG. 4 is a partial perspective view showing the calibrating or metering shunt device, including its posts and brackets for connecting it to the electromagnetic sensing device and the movable contact arms.
Figure 5:
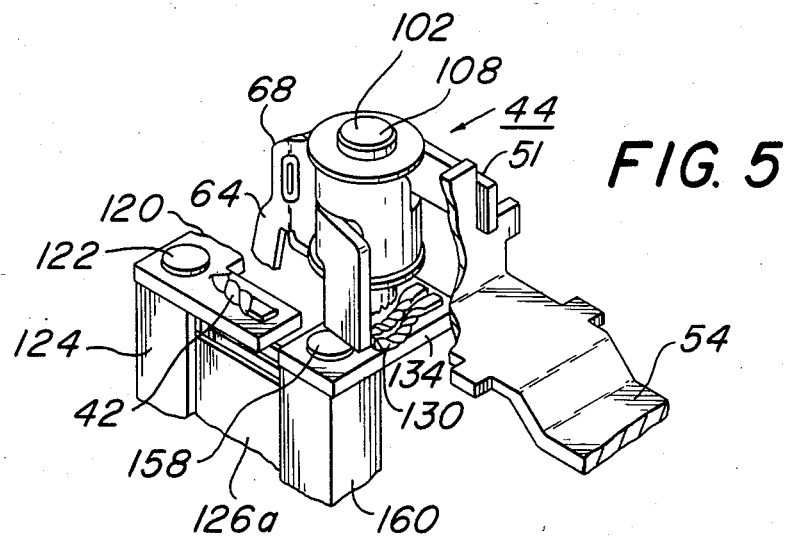
FIG. 5 is a partial perspective view of the electromagnetic sensing device viewed from the back relative to FIG. 3.

The metering or calibrated shunt device 43 of this invention comprises a U-shaped bracket 120 to which the two flexible conductors 42 are welded, one conductor being welded to each leg of the "U" of the bracket 120, FIG. 3. A suitable threaded stud 122 is clinched to the bracket 120 and extends through a post 124, FIG. 4. Likewise, the flexible conductor 130 is welded at its midportion to the end portion 41 of the coil 44 and has its two ends welded to a bracket 134. A further threaded stud 158 is clinched to the bracket 134 and extends through a further post 160. Extending between the posts 124 and 160 and welded or brazed thereto in suitable slots formed therein are shunt plates 126a, 126b and 126c.

To electrically separate the flexible conductor 130 from the adjacent parts, an insulator having a horizontal leg 135 is placed between the conductor 130 and the tube 102 and an approximately vertical leg 137 is placed between the tube 102 and the flexible conductors 42, as shown in FIG. 2.

Secured to the studs 122 and 158 against the lower ends of the posts 124 and 160 are terminals 161a and 127a by silver plated copper washers 161b and 127b and silver plated nuts 161 and 127. The terminals 161a and 127a are carried by suitably insulated wires 348 and 349 whose other ends carry male plugs 350 and 351, FIG. 2.

The shunt plates 126a, 126b and 126c are made large enough and of a highly conductive material to provide a very low resistance to the flow of current between the flexible conductors 42, on the one end, and the flexible conductor 130, on the other end, FIGS. 2 and 3. Preferably, the lower end faces of the posts 124 and 160, FIG. 4, against which abut the terminals 161a and 127a are also silver plated to increase conductivity. Thus, the voltage drop across the shunt device 43 will be very low and the resultant heat loss will also be low.

The metering or calibrated shunt device 43 is secured to the case 18 by virtue of the brackets 120 and 134 having portions projecting into slots in the half-cases 69 and 70 and resting upon the lower walls 170 of the half-cases 69 and 70.

The metering or calibrated shunt device 43 is also provided with a suitable cover 175 which is attached to the case 18 by a suitable screw 176 threaded into a suitable nut 177 trapped between the half-cases 69 and 70, for example, as shown in FIG. 2. The width of the posts 124 and 160 and of the plates 126a, 126b and 126c disposed between them is less than the width bounded between the two side faces of the case 18. The cover 175 thus has a width which is the same as or slightly less than the width of the case 18. Further, the portion of the metering or calibrated shunt device 43 which extends beyond the case 18 extends below the case 18, as shown in FIGS. 1 and 2, and between the terminals 40 and 54. Thus, the addition of the metering or calibrated shunt device 43 does not interfere with the stacking in side-by-side relationship a number of circuit breaker poles with or without the metering shunt device 43.

In one embodiment the posts 124 and 160 are made of copper and the shunt plates 126a, 126b and 126c of a manganese-copper alloy whose resistance will not vary significantly as its temperature rises, such alloys being well known in the art, i.e., the resistance of such materials remains substantially constant over a wide variation in temperature. In one instance, a voltage drop across the calibration points, i.e., where the terminals 161a and 127a are secured, of 25 millivolts was desired. The resistance of the shunt device 43 was adjusted by varying the cross-sectional area of the shunt plates 126a, 126b and 126c so that the desired voltage drop of 25 millivolts was achieved. By properly varying the cross-sectional area of the shunt plates, the voltage drop can be kept at 25 millivolts for circuit breakers rated to carry different amounts of current, although a typical circuit breaker is rated at 225 amperes. If the current through the circuit breaker is more or less than the rated current, the voltage drop read by a voltmeter connected across the calibration points will be proportionately more or less.

While this invention has been described and illustrated in a circuit breaker 10 with a double movable arm, i.e., the two arms 36 shown in FIG. 3, it will be understood that this invention is not limited to such a construction nor to the other details of the described circuit breaker.

It should also be noted that the sensing of the voltage across the metering or calibrated shunt device 43 can be used to switch another circuit "on" or "off" depending on the variation of the voltage at the metering shunt device 43 and a suitable switching circuit (not illustrated) could be connected to the terminals 161a and 127a or directly to the shunt device 43 at the calibration points.

Having described this invention, I claim:

1. A single pole, single section circuit breaker comprising an electromagnetic sensing means, a set of relatively movable contacts comprising a movable contact and a stationary contact, a mechanism for opening and closing said contacts in response to said electromagnetic sensing means, and a calibrated shunt means connected to said movable contact at one end and to said electromagnetic sensing means at the other end, and not across the switch contacts, to provide a predetermined low voltage drop at a predetermined current through said circuit breaker.

2. The combination of claim 1 and further including a case, line and load terminals carried by said case, said stationary contact being carried by said line terminal, a movable contact arm, said mechanism including linkage means for moving said movable arm between open and closed positions, said electromagnetic sensing means tripping open said contacts on predetermined electrical conditions, said electromagnetic sensing means being electrically connected at one end to said load terminal, and said calibrated shunt means being carried by said case between said line and load terminals.

3. The combination of claim 2 wherein said calibrated shunt means comprises at least one shunt plate, first bracket and post means for electrically connecting the movable arm to one end of said shunt plate, and second bracket and post means for electrically connecting one end of said electromagnetic sensing means to the other end of said shunt plate.

4. The combination of claim 3 wherein said first bracket and post means secures said shunt plate to said case.

5. The combination of claim 4 wherein said second bracket and post means also secures said shunt plate to said case.

6. The combination of claim 3 wherein said electromagnetic sensing means includes a coil, a threaded stud and a post through which said stud extends, first flexible conductors connecting the movable arm to said first bracket means, second flexible conductors connecting said coil to said second bracket means, and said studs extending through said posts and being suitably secured thereto.

7. The combination of claim 1 wherein said calibrated shunt means include a shunt plate made from a material whose resistance does not vary substantially as its temperature varies.

8. The combination of claim 7 wherein said shunt plate is made from a manganese-copper alloy.

9. The combination of claim 3 wherein said shunt plate and said post means extend rearwardly of said case within the space bounded by the side faces of said case and between said line and load terminals.

10. The combination of claim 9 and further including a cover for said shunt plate and said post means, said cover not extending beyond the space bounded by the side faces of said case.

* * * * *